United States Patent [19]

Koo

[11] 4,156,249

[45] May 22, 1979

[54] SOLID STATE TUNABLE CAPACITOR

[75] Inventor: Tuh-Kai Koo, Colorado Springs, Colo.

[73] Assignee: NCR Corporation, Dayton, Ohio

[21] Appl. No.: 912,820

[22] Filed: Jun. 5, 1978

Related U.S. Application Data

[63] Continuation of Ser. No. 766,180, Feb. 7, 1977, abandoned, which is a continuation of Ser. No. 610,948, Sep. 8, 1975, abandoned.

[51] Int. Cl.² ............................................. H01L 27/02
[52] U.S. Cl. ......................................... 357/51; 357/14; 357/23; 357/54
[58] Field of Search ......................... 357/14, 23, 51, 54

[56] References Cited

U.S. PATENT DOCUMENTS

| 3,890,631 | 6/1975 | Tiemann | 357/14 |
| 3,906,539 | 9/1975 | Sauermann et al. | 357/14 |

FOREIGN PATENT DOCUMENTS 2451364  5/1975  Fed. Rep. of Germany ............. 357/14

Primary Examiner—Edward J. Wojciechowicz
Attorney, Agent, or Firm—J. T. Cavender; Lowell C. Bergstedt; Philip A. Dalton

[57] ABSTRACT

A semiconductor tunable capacitor is described. This tunable capacitor employs a plurality of metal-insulator-semiconductor (MIS) capacitive segments and each element has a first and a second value of capacitance. The solid state capacitor employs a plurality of tuning terminals and a single capacitor terminal. Tuning signals are applied to each of the tuning terminals for switching that capacitive segment into its high or low capacitive state. The capacitor terminal is capacitively connected to each capacitive segment and is employed for summing the individual values of capacitance into a total value of capacitance. An MNOS capacitor is shown as the preferred embodiment.

3 Claims, 5 Drawing Figures

SOLID STATE TUNABLE CAPACITOR

This is a continuation, of application Ser. No. 766,180, filed Feb. 7, 1977, now abandoned which is a continuation of application Ser. No. 610,948, filed Sept. 8, 1975 now abandoned.

BACKGROUND OF THE INVENTION

The present invention relates to solid state capacitors, and more particularly, to a multi-segment tunable capacitor.

Discrete capacitors and solid state capacitors, such as variable capacitive diodes and varactor diodes are well known in the prior art. Metal-insulator-semiconductor (MIS) such as MNOS capacitors are also well known.

A MIS capacitor comprises successive layers of a metal, insulator and silicon. In an MOS structure, the insulator is an oxide layer. In a MNOS structure, the insulator layer includes a nitride layer as well as an oxide layer. This gives the MNOS structure a memory capability which is well known in the art, while the MOS structure exhibits its set value of capacitance only when the bias signal is applied to the gate electrode portion of the MOS structure.

The MIS prior art capacitor exhibits a first capacitive value when the bias signal applied to its gate electrode exceeds its threshold voltage, and the MIS prior art capacitor exhibits a second capacitive value when the bias signal applied to its gate electrode is less than its threshold value. By varying the level of the bias signal, the MIS capacitor is caused to exhibit different values of capacitance.

This mode of operation is to be contrasted to the preferred embodiment described herein which is an MNOS capacitor. In the preferred embodiment, the MNOS capacitor is given a first or second capacitive value by the application of a write or erase signal. However, when the write or erase signal is removed, the MNOS capacitor structure retains that capacitance value set by the write or erase signal, as is well known in the art. This capability to retain the set capacitive value is also referred to as a memory capability.

In the typical operation of MNOS capacitors with P-type silicon as the substrate, the application of a positive, erase signal to the capacitor terminal creates a negative charge at the oxide-nitride interface for generating a first relatively low value of capacitance. The application of a negative, write signal to the capacitor creates a positive charge at the same oxide-nitride interface for generating a second relatively high value of capacitance. This change in capacitance value of a MNOS capacitor follows the very familiar hysteresis type curve associated with magnetic substances. Accordingly, the capacitance value of the MNOS capacitor changes from a first relatively low stable value to a second relatively high stable value along the familiar hysteresis pathways dependent upon the application to the capacitor of a negative or a positive signal, respectively.

The capacitance exhibited by the MNOS structure is also alterable by its process of manufacture. More specifically, the capacitance value of the MNOS structure is determined in part by the thickness of the oxide layer, and/or the thickness of the nitride layer, and/or the thickness of the field oxide layer, and/or the surface charge on the semiconductor body in which the MNOS capacitor is built.

SUMMARY OF THE INVENTION

An object of the present invention is to provide a tunable MIS semiconductor capacitor.

Another object of the present invention is to provide a tunable MIS semiconductor capacitor which comprises a plurality of individual sections and each section is settable to a predetermined value of capacitance.

A further object of the present invention is to provide a tunable MIS semiconductor capacitor having a plurality of connectable MIS structures.

A still further object of the present invention is to provide a tunable MNOS capacitor having a plurality of individual sections, and each section is individually tunable to one of two values of capacitance.

Another object of the present invention is to provide a tunable MNOS semiconductor capacitor wherein the value of capacitance of each individual section is alterable by the application of a voltage signal to the tuning terminal of the capacitor.

A still further object of the present invention is to provide a tunable MNOS semiconductor capacitor using a single capacitor output line capacitively coupled to a plurality of tunable capacitive segments.

These and other objects of the preferred embodiment will become apparent by the following complete description of the invention and by the accompanying drawings.

BRIEF DESCRIPTION OF THE INVENTION

A tunable capacitor is described which employs a plurality of separate MIS structures which are connectable in various combinations. Each different combination results in a capacitor which exhibits a different value of capacitance.

An MNOS structure is usable to provide a tunable capacitor which exhibits a memory effect. The MNOS structure employs a tuning capacitor terminal for altering the capacitive value of the capacitor, and a capacitor terminal on which the capacitive value of the capacitor is sensed.

Also, a multi-segment tunable capacitor is described which employs a plurality of individual MNOS capacitive segments. Each capacitive segment employs an individual tuning terminal by which the capacitive value of that segment is set to either one of its two capacitive values. Write and erase signals are applied to the tuning terminal for changing the MNOS capacitor to either of its two stable states. A single capacitor terminal is provided which is capacitively coupled to each of the segments. A bias signal is applied to the capacitor terminal for sampling the capacitive value of the multi-segment capacitor.

DETAILED DESCRIPTION OF THE INVENTION

Figure 1:
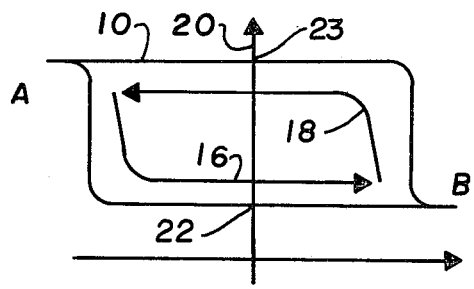
FIG. 1 shows a typical capacitive-voltage characteristic curve for an MNOS capacitor.

Referring to FIG. 1, there can be seen a capacitive-voltage characteristic curve generally indicated at 10 helpful in explaining the operation of a MNOS capacitor. The characteristic curve 10 is shown in a standard hysteresis format and has a first stable condition at point A representing the written condition, and a second stable position at point B representing the erased condition. The application of a positive signal causes the operating point of the MNOS capacitor, shown in FIG. 1, to move along the hysteresis curve as indicated generally by the arrow 16 to reach the stable state at B. The capacitor remains in this stable condition until changed by a strongly negative erase signal. The strong negative signal causes a positive charge to be stored at the oxide-nitride interface of the capacitor. This is graphically indicated by the arrow 18 showing the movement to the second stable position at A.

The value of the capacitance stored in the capacitor is indicated by the arrow 20 and the intersection of this arrow 20 with portions of the characteristic curve 10 at 22 and 23, respectively. The value of the capacitance is taken between a capacitor terminal 20 and a substrate member 28, as shown best in FIG. 3. The value of capacitance at 23 can differ from the value of capacitance at 22 by as much as a factor of ten.

Figure 2:
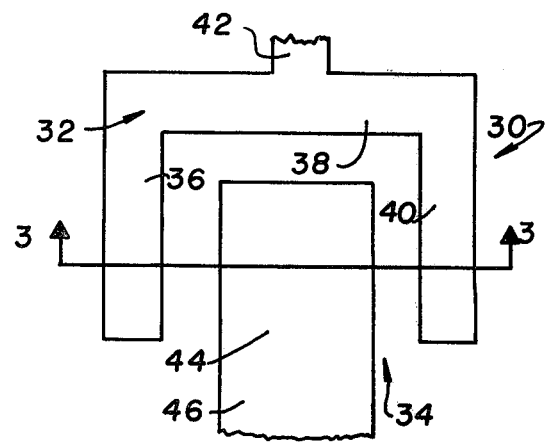
FIG. 2 shows a top view of a first embodiment of a tunable capacitor having a single section.

Referring to FIG. 2, there can be seen a top view of a tunable capacitor, indicated generally at 30. The tunable capacitor employs a tuning terminal 32 and a capacitor terminal 34. The tuning terminal includes an active region indicated generally as comprising segments 36, 38 and 40. The tuning segments also include an inactive portion 42 which is used for connecting the terminal to circuits off the semiconductor chip or on another portion of the semiconductor chip. The inactive region is further described as that portion overlying the field oxide layer. The inactive region is not associated with a depletion or accumulation region in the semiconductor body. The capacitor terminal 34 comprises an active region generally indicated at 44 and an inactive region at 46. The active region 44 is further described as overlying the depletion region and/or accumulation region created by the application of a positive pulse and/or a negative pulse to the tuning terminal, respectively.

Figure 3:
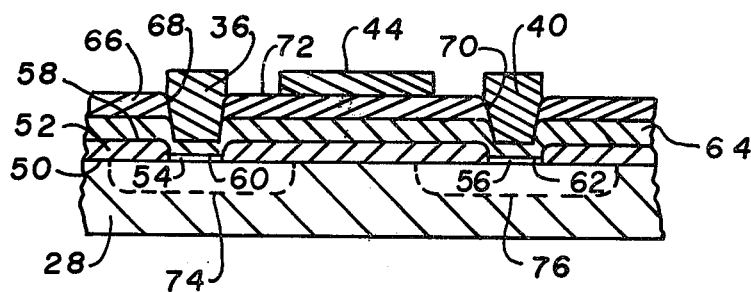
FIG. 3 is a cross-sectional view taken along the line 3—3 in FIG. 2.

Referring to FIG. 3, there can be seen a cross-sectional view of the tunable capacitor taken along the lines 3—3 of FIG. 2. A heavily doped substrate is shown at 28 having an upper surface 50 on which is formed an oxide layer shown at 52 and memory gate oxide layers 54 and 56. On the upper surface 58 of the field oxide layer 52, and on the upper surfaces 60 and 62 of the gate oxide layers 54 and 56, respectively, a nitride layer 64 is formed. In a second embodiment, the layer 64 can be a second oxide layer. A surface passivation layer is shown at 66. Apertures 68 and 70 extend through the surface passivation layer 66 and partially through the nitride layer 64. Portions 36 and 40 of the tuning terminal 32 are positioned in the apertures 68 and 70. Portion 44 of the capacitor terminal 34 is shown positioned on an upper surface 72 of the passivation oxide layer 66. The spacing between portion 44 of the capacitor terminal and portions 36 and 40 of the tuning terminal is approximately 1.0 micron. Dotted lines 74 and 76 represent the outermost portions of the depletion regions and/or accumulation regions created by the application of a strong positive pulse or negative pulse, respectively, to the tuning terminal 32. The depletion and/or accumulation regions 74 and 76 extend under the capacitor terminal 44 and affects the value of the capacitance sensed by the application of a bias signal to the capacitor terminal 44.

The application of a negative pulse to the tuning terminal 32 creates an accumulation region under the capacitor terminal 44. This results in a high value of capacitance being sensed by the application of a bias signal to the capacitor terminal 34. The application of a positive pulse to the tuning terminal 32 creates depletion regions 74 and 76 under the active portion 44 of the capacitor terminal 44. This results in a low value of capacitance being sensed by the application of a bias signal to the capacitor terminal 34.

In the preferred embodiment, a positive pulse of +30 volts is used for creating a depletion region in the substrate 28. This provides a relatively low value of capacitance. A negative pulse of −30 volts is employed to create and accumulation region under the substrate 28. This provides a relatively high value of capacitance. The spacing of the capacitor terminal 34 from the tuning terminal 30 affects the value of capacitance sensed by the application of a bias signal on the capacitor terminal. Additionally, the use of a higher or lower voltage as the positive and/or negative tuning pulse typically, only affects the time period within which the full negative charge or positive charge is stored in a depletion region or accumulation region, respectively.

Figure 4:
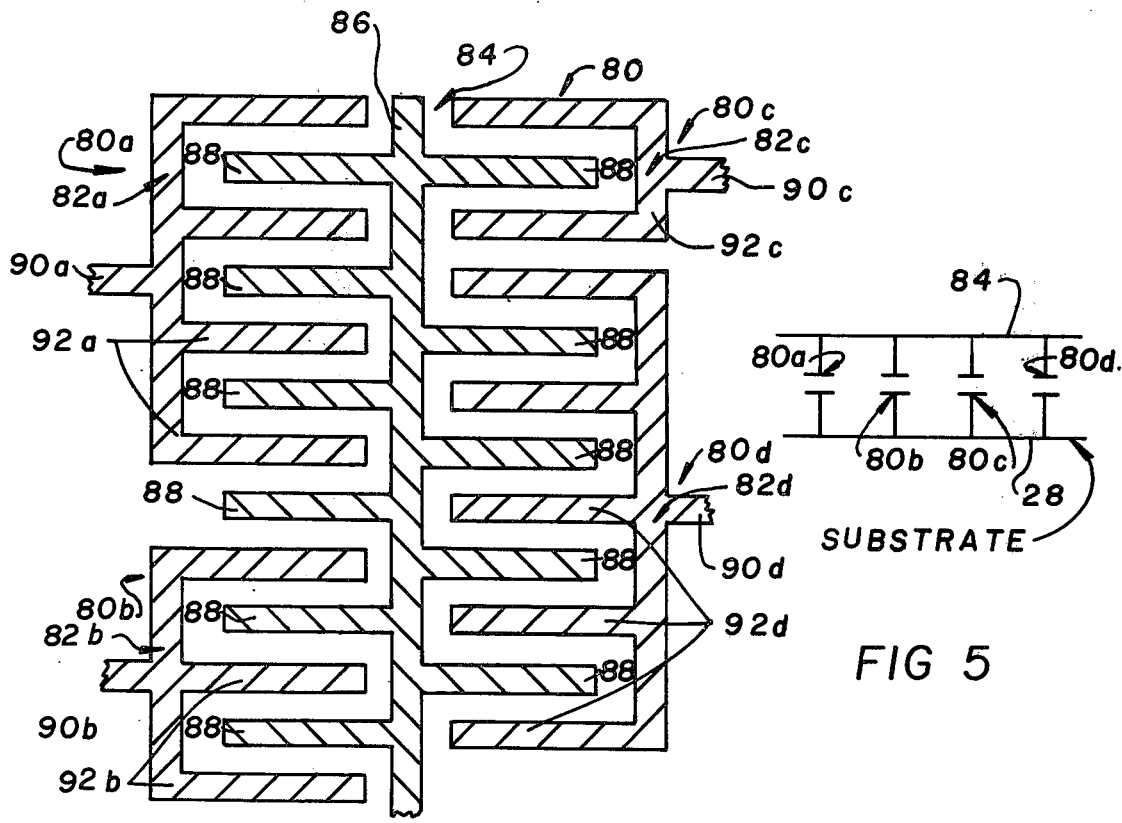
FIG. 4 is a top view showing a second embodiment of a tunable capacitor having a plurality of sections.

Referring to FIG. 4, there can be seen a tunable capacitor indicated generally at 80 and having a plurality of sections 80a, 80b, 80c and 80d. Each of the segments is provided with a tuning terminal 82a, 82b, 82c and 82d, respectively. A single capacitor terminal is shown at 84.

The single capacitor terminal 84 is provided with a central member 86 and a plurality of side extensions at 88.

Each of the capacitive segments 80a and 80b, 80c and 80d is different in size from each other segment so as to indicate that each of the capacitive segments has a different value of capacitance. Each of the tuning terminals 82a, 82b, 82c and 82d include individual inactive portions 90a, 90b, 90c and 90d. The inactive portions 90a, 90b, 90c and 90d are used for connections to other portions of the chip or to external circuitry. Also, the write and erase signals are applied to the inactive portions 90a, 90b, 90c and 90d for connections to the active portions 92a, 92b, 92c and 92d of the tuning terminal.

Write and/or erase signals are applied to the tuning terminals 82a, 82b, 82c and 82d to set such MNOS capacitor to either of its stable states. The value of capacitance from each individual segment of the MNOS capacitor is capacitively coupled to the capacitor terminal 84 and is read out by the application of a bias signal to the capacitor terminal 84, as shown with reference to FIG. 1. Depending upon whether or not a write and/or an erase signal was last applied to each of the segments 80a, 80b, 80c and 80d, the value of capacitance in each segment would differ and hence the total value sensed by the capacitor terminal 34 would differ.

When N capacitor segments 82 are used, then the capacitor may have $2N^{th}$ possible states or possible values of capacitance.

Figure 5:
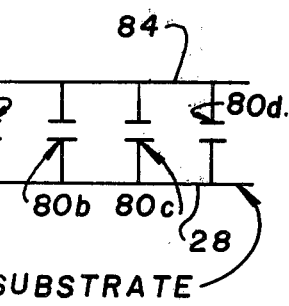
FIG. 5 is a schematic representation of the capacitor shown in FIG. 3 having its sections connected in parallel.

Referring to FIG. 5, there can be seen a schematic diagram of one form of the tunable capacitor shown in FIG. 4. In FIG. 5, the sections 80a, 80b, 80c and 80d of the capacitor 80 are connected in parallel between the substrate indicated at 28 and the capacitor terminal 84. Obviously, the capacitor can also be connected in parallel, or also certain of the capacitors can be connected in series and/or in parallel as the designer desires.

When MOS capacitor structures are used, the bias voltage is applied to the tuning terminal such as 32 as shown in FIG. 2 and 82a, 82b, 82c and 82d as shown in FIG. 4. In the preferred embodiment, this bias voltage is set to a predetermined level so that a particular section or group of sections would exhibit a desired value of capacitance. This bias signal would remain on during the normal mode of operation when using an MOS structure. This is to be constrasted with an MNOS structure which uses an erase or write signal to set the MNOS device to one of its two stable levels of capacitance. Then the erase or write signal is removed. The memory capability of the MNOS structure operates to preserve that capacitance value set into the MNOS capacitor by the erase or write structure.

While the invention has been shown and described with reference to several embodiments, it will be understood by those skilled in the art that various changes in form and details may be made therein without departing from the spirit and scope of the invention.

What is claimed is:

1. An electrically alterable, memory capacitance device, comprising:

a semiconductor substrate having a major surface and a plurality of spaced-apart major surface regions formed therein for forming one of depletion regions or accumulation regions upon application of a depletion-causing voltage or an accumulation-causing voltage across the substrate;

a layered insulator structure formed on the major surface of the substrate, the insulator structure including charge-storing portions overlying the spaced-apart surface regions;

a plurality of interconnected first electrodes formed on the insulator structure, each of the first electrodes overlying the insulator structure and being interdigitated with the spaced-apart surface regions for providing a capacitance between each first electrode and the substrate of first and second magnitudes determined by the presence or absence of depletion regions or accumulation regions at adjacent ones of the spaced-apart surface regions; and a plurality of selectively interconnected second electrodes overlying the charge storage portions and cooperating with the substrate for applying depletion-causing voltage or accumulation-causing voltage across the charge storage portions;

the second electrodes being interconnected in electrically distinct groups for separately varying the capacitance provided by those first electrodes associated with each group.

2. The electrically alterable, memory capacitance device of claim 1 wherein the layered insulator structure comprises a layer of silicon nitride and a layer of silicon oxide interposed between the silicon nitride layer and the substrate.

3. The electrically alterable, memory capacitance device of claim 1 or 2 wherein each of the first electrodes is spaced about one micron from each of the second electrodes overlying the spaced-apart surface regions adjacent each first electrode.

* * * * *